United States Patent
Kim et al.

(10) Patent No.: US 7,633,785 B2
(45) Date of Patent: Dec. 15, 2009

(54) SEMICONDUCTOR MEMORY DEVICE AND METHOD OF GENERATING CHIP ENABLE SIGNAL THEREOF

(75) Inventors: Doo-Gon Kim, Suwon-si (KR); Youn-Cheul Kim, Dongdaemun-gu (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 335 days.

(21) Appl. No.: 11/775,245

(22) Filed: Jul. 10, 2007

(65) Prior Publication Data
US 2009/0015291 A1    Jan. 15, 2009

(51) Int. Cl.
*G11C 5/02* (2006.01)
(52) U.S. Cl. .................. 365/51; 365/63; 365/189.03; 711/103
(58) Field of Classification Search .................. 365/63, 365/51, 52, 189.01, 191, 230.01; 711/230.05
See application file for complete search history.

(56) References Cited

U.S. PATENT DOCUMENTS

| | | | |
|---|---|---|---|
| 7,379,316 B2 * | 5/2008 | Rajan | 365/63 |
| 2004/0257847 A1 | 12/2004 | Matsui et al. | |
| 2005/0099834 A1 * | 5/2005 | Funaba et al. | 365/63 |
| 2006/0262587 A1 * | 11/2006 | Matsui et al. | 365/63 |
| 2007/0064462 A1 * | 3/2007 | Matsui | 365/63 |

FOREIGN PATENT DOCUMENTS

| | | |
|---|---|---|
| JP | 08-083217 | 3/1996 |
| JP | 2000-049277 | 2/2000 |
| JP | 2001-307057 | 11/2001 |
| JP | 2004-327474 | 11/2004 |

* cited by examiner

*Primary Examiner*—Pho M Luu
*Assistant Examiner*—Toan Le
(74) *Attorney, Agent, or Firm*—Volentine & Whitt, PLLC

(57) ABSTRACT

Provided are a semiconductor memory device and a method of generating a chip enable signal thereof. The device includes a plurality of memory chips and an interface chip that are stacked. Each of the memory chips includes a control signal setting unit, which sets input signals applied to first and second input nodes as less significant 2-bit control signals of n-bit control signals, performs a logic AND operation on the less significant 2-bit control signals to generate AND operated signals, performs a logic XOR operation on each of the AND operated signals and each bit signal of more significant n−2-bit input signals applied to third to n-th input nodes to set the n−2-bit control signals, outputs the signal applied to the second input node through a first output node, inverts the signal applied to the first input node to output the inverted signal through a second output node, and outputs the more significant n−2-bit input signals through third through n-th output nodes, respectively. The first through n-th output nodes of one of two adjacent memory chips are respectively connected to the first through n-th input nodes of the other of the two adjacent memory chips.

38 Claims, 12 Drawing Sheets

SEMICONDUCTOR MEMORY DEVICE AND METHOD OF GENERATING CHIP ENABLE SIGNAL THEREOF

BACKGROUND OF THE INVENTION

1. Field of the Invention

The present invention relates to a semiconductor memory device and, more particularly, to a semiconductor memory device in which a plurality of chips are stacked and packaged and a method of generating a chip enable signal thereof.

2. Description of Related Art

In general, a semiconductor memory device is fabricated by packaging a single chip. Thus, both a memory portion for storing data and a control portion for controlling the input/output of data in/from the memory portion are integrated in the single chip.

However, a semiconductor memory device packaged by stacking a plurality of chips has recently been introduced. In the semiconductor memory device, a control portion is provided in one of the chips, and a memory portion is provided in each of the remaining chips.

In the semiconductor memory device in which the chips are stacked and packaged, each of the chips should include a chip enable signal generation circuit to enable the input/output of data in/from one of the chips. Chip enable signal generation circuits included in the chips should have the same configuration so that the respective chips can be fabricated using the same process. When the respective chip enable signal generation circuits have different configurations, additional masks should be prepared to form different mask patterns required for the respective chips.

FIG. 1 is a diagram showing the configuration of a conventional semiconductor memory device in which a plurality of chips are stacked.

Referring to FIG. 1, the semiconductor memory device includes an i+1 number of memory chips 10-1 to 10-$i$ and an interface chip 12. Each of the memory chips 10-1 to 10-$i$ includes a memory cell array portion (not shown) and the corresponding one of counters CNT1 to CNTi, and the interface chip 12 includes a controller (not shown) and a chip identification (ID) code generator CIG. Also, the counters CNT1 to CNTi of the memory chips 10-1 to 10-$i$ are cascade-connected to one another.

Functions of the semiconductor memory device shown in FIG. 1 will now be described.

The chip ID code generator CIG generates a start counting value as a chip ID code. The counter CNT1 of the memory chip 10-1 receives the start counting value, performs a counting operation, and outputs a 1-added output value. The counter CNT2 receives the output value of the counter CNT1, performs a counting operation, and outputs a 1-added output value. In the same manner, the counters 10-1 to 10-$i$ sequentially output 1-added values. Thus, the counters 10-1 to 10-$i$ output respectively different output values and generate chip enable signals for enabling operation of the corresponding memory chip using the output value and an externally applied chip ID signal (e.g., an address signal).

The conventional semiconductor memory device shown in FIG. 1 has been published in detail in U.S. Patent Publication No. 2004/0257847.

In the foregoing conventional semiconductor memory device, the respective memory chips 10-1 to 10-$i$ have the same configuration, so that the memory chips 10-1 to 10-$i$ can be fabricated using the same fabrication process. However, since the counters CNT1 to CNTi of the memory chips 10-1 to 10-$i$ are cascade-connected to one another, a next counter generates a delayed output value due to previous counters, thus adversely affecting high-speed operation of the semiconductor memory device. Also, the circuit configuration of the semiconductor memory device becomes complicated because each of the counters CNT1 to CNTi includes flip-flops.

SUMMARY OF THE INVENTION

An embodiment of the present invention provides a semiconductor memory device in which respective stacked chips have the same configuration and simple circuit configuration to generate chip enable signals without delay.

Another embodiment of the present invention provides a method of generating a chip enable signal of a semiconductor memory device, which can generate chip enable signals without delay.

In one aspect, the present invention is directed to a semiconductor memory device including a plurality of memory chips and an interface chip that are stacked. Each memory chip includes a control signal setting unit, which sets input signals applied to first and second input nodes as less significant 2-bit control signals of n-bit control signals, performs a logic AND operation on by the less significant 2-bit control signals to generate AND operated signals, performs a logic XOR operation on each of the AND operated signals and each bit signal of more significant n–2-bit input signals applied to third to n-th input nodes to set the n–2-bit control signals, outputs the signal applied to the second input node through a first output node, inverts the signal applied to the first input node to output the inverted signal through a second output node, and outputs the more significant n–2-bit input signals through third through n-th output nodes, respectively. First through n-th output nodes of one of two adjacent memory chips are respectively connected to first through n-th input nodes of the other of the two adjacent memory chips.

The input signals may be applied to the first through n-th input nodes of one memory chip disposed adjacent to the interface chip during a mode register set (MRS) operation. Alternatively, a power supply voltage or a ground voltage may be applied to the first through n-th input nodes of one memory chip disposed adjacent to the interface chip during the MRS operation.

The control signal setting unit may include: an inverter for inverting the input signal applied to the first input node to generate a first signal; AND gates for performing a logic AND operation on by the less significant 2-bit input signals of the n-bit input signals applied to the first through n-th input nodes to generate second signals; and XOR gates for performing a logic XOR operation on each of the second signals and each of the input signals applied to the third to n-th input nodes to generate the more significant n–2-bit control signals.

The control signal setting unit may further include an electrical fuse program circuit, which is enabled during the MRS operation and programs the control signals depending on whether a fuse is cut or not in response to the input signals applied to the first and second input nodes and each bit signal of the more significant n–2-bit control signals. Alternatively, the control signal setting unit may further include a storage portion, which stores and outputs the input signals applied to the first and second input nodes and each bit signal of the more significant n–2-bit control signals.

Each of the memory chips may further include an enable signal generation unit, which generates a chip enable signal when the n-bit control signal is equal to an n-bit chip identification (ID) signal. In this case, the chip ID signal, which is used to select one of the memory chips, may be applied along with a row address, a bank address, or a column address during a normal operation. The enable signal generation unit may include: multiplexers for generating a first-state comparison signal when each of the n-bit control signals is equal to each of the n-bit chip ID signals and generating a second-state comparison signal when each of the n-bit control signals is not equal to each of the n-bit chip ID signals; and an AND gate for generating the chip enable signal when the multiplexers generate the first-state comparison signals.

In another aspect, the present invention is directed to a semiconductor memory device including a plurality of memory chips and an interface chip that are stacked. Each memory chip may include a control signal setting unit, which generates input signals applied to first through n-th input nodes as n-bit control signals and performs a logic AND operation on the input signals applied to the first through n-th input nodes and less significant bit signals of the respective input signals applied to the first through n-th input nodes and outputs respective sum signals on each of the input signals through second through n-th input nodes and respective bit signals excluding n-th bit signal of respective AND operated signals obtained by performing the logic AND operation to second through n-th output nodes, respectively. First through n-th output nodes of one of two adjacent memory chips are respectively connected to first through n-th input nodes of the other of the two adjacent memory chips.

The input signals may be applied to the first through n-th input nodes of one memory chip disposed adjacent to the interface chip during an MRS operation. Alternatively, a power supply voltage or a ground voltage may be applied to the first through n-th input nodes of one memory chip disposed adjacent to the interface chip during the MRS operation.

The control signal setting unit may further include an electrical fuse program circuit, which is enabled during the MRS operation and programs the control signals depending on whether a fuse is cut or not in response to each of bit signal of the input signals applied to the first through n-th input nodes. Alternatively, the control signal setting unit may further include a storage portion, which stores and outputs the input signals applied to the first through n-th input nodes.

In an embodiment of the present invention, the control signal setting unit may include: XOR gates for performing a logic XOR operation on each bit signal of n-bit input signals applied through the first through n-th input nodes and each of carry signals of a previous stage to generate the sum signals; and AND gates for performing a logic AND operation on each bit signal of the n-bit input signals applied through the first through n-th input nodes and the carry signals applied from the previous memory chip to generate carry signals. In this case, an first stage XOR gate of the XOR gates may perform a logic XOR operation on the input signal applied through the first input node and a high-level signal to generate the sum signal, and a first stage AND gate of the AND gates may perform a logic AND operation on the input signal applied through the first input node and the high-level signal to generate the carry signal.

In another embodiment of the present invention, the control signal setting unit may include: an inverter for inverting a least significant bit input signal applied through the first input node to output the inverted signal through the first output node; XOR gates for performing a logic XOR operation on each of n−1-bit input signals applied through the second to n-th input nodes and a carry signal of a previous stage to generate the sum signals; and AND gates for performing a logic AND operation on each of the n−1-bit input signals applied through the second to n-th input nodes and the carry signal applied from the previous memory chip to generate carry signals. In this case, a first stage XOR gate of the XOR gates may perform a logic XOR operation on the input signal applied through the first input node and the input signal applied through the second input node to generate the sum signal, and an initial AND gate of the AND gates may perform a logic AND operation on the input signal applied through the first input node and the input signal applied through the second input node to generate the carry signal.

Each of the memory chips may further include an enable signal generation unit, which generates a chip enable signal when the n-bit control signal is equal to an n-bit chip ID signal. In this case, the chip ID signal, which is used to select one of the memory chips, may be applied along with a row address, a bank address, or a column address during a normal operation.

The enable signal generation unit may include: multiplexers for generating a first-state comparison signal when each of the n-bit control signals is equal to each of the n-bit chip ID signals and generating a second-state comparison signal when each of the n-bit control signals is not equal to each of the n-bit chip ID signals; and an AND gate for generating the chip enable signal when the multiplexers generate the first-state comparison signals.

In still another aspect, the present invention is directed to a semiconductor memory device including four or fewer memory chips and an interface chip that are stacked. Each memory chip includes an enable signal generation unit, which performs a logic AND operation on input signals applied to first and second input nodes to generate a chip enable signal, outputs the input signal applied to the second input signal through a first output node, and inverts the input signal applied to the first input node to output the inverted signal through a second output node. First and second output nodes of one of two adjacent memory chips are respectively connected to first and second input nodes of the other of the two adjacent memory chips. The input signals applied to the first and second input nodes of a memory chip disposed adjacent to the interface chip may be applied along with a row address, a bank address, or a column address during a normal operation.

The enable signal generation unit may include: an AND gate for performing a logic AND operation on the input signals applied to the first and second input nodes; and an inverter for inverting the input signal applied to the first input node.

In yet another aspect, the present invention is directed to a method of generating a chip enable signal of a semiconductor memory device in which a plurality of memory chips and an interface chip are stacked and packaged. Each memory chip includes first through n-th input nodes and first through n-th output nodes, and first through n-th input nodes of one of two adjacent memory chips are respectively connected to first through n-th output nodes of the other of the two adjacent memory chips. The method includes: setting 2-bit input signals applied to the first and second input nodes as less significant 2-bit control signals of n-bit control signals and performing a logic AND operation on by the less significant 2-bit control signals to generate AND operated signals; performing a logic XOR operation on each of the AND operated signals and each bit signal of more significant n−2-bit input signals applied to the third to n-th input nodes to generate n−2-bit control signals; outputting the signal applied to the second input node through a first output node, outputting an inverted signal of the signal applied to the first input node through a second output node, and outputting the more significant n−2-bit input signals through third to n-th output nodes, respectively; storing and outputting the control signal during an MRS operation; and generating the chip enable signal during a normal operation when the control signal is equal to a chip ID signal output from the interface chip.

In yet another aspect, the present invention is directed to a method of generating a chip enable signal of a semiconductor memory device in which a plurality of memory chips and an interface chip are stacked and packaged. Each memory chip includes first through n-th input nodes and first through n-th output nodes, and first through n-th input nodes of one of two adjacent memory chips are respectively connected to first through n-th output nodes of the other of the two adjacent memory chips. The method includes: generating input signals applied to the first through n-th input nodes as n-bit control signals; performing a logic AND operation on the input signals applied to the first through n-th input nodes and less significant bit signals of the respective input signals applied to the first through n-th input nodes and outputting respective sum signals on each of the input signals through second through n-th input nodes and respective bit signals excluding n-th bit signal of respective AND operated signals obtained by performing the logic AND operation to second through n-th output nodes, respectively, storing and outputting the control signal during an MRS operation; and generating the chip enable signal during a normal operation when the control signal is equal to a chip ID signal output from the interface chip.

BRIEF DESCRIPTION OF THE DRAWINGS

The foregoing and other objects, features and advantages of the present invention will be apparent from the more particular description of exemplary embodiments of the invention, as illustrated in the accompanying drawings. The drawings are not necessarily to scale, emphasis instead being placed upon illustrating the principles of the invention.

DETAILED DESCRIPTION OF THE INVENTION

A semiconductor memory device and a method of generating a chip enable signal thereof according to the present invention will be described more fully hereinafter with reference to the accompanying drawings, in which exemplary embodiments of the invention are shown.

Figure 1:
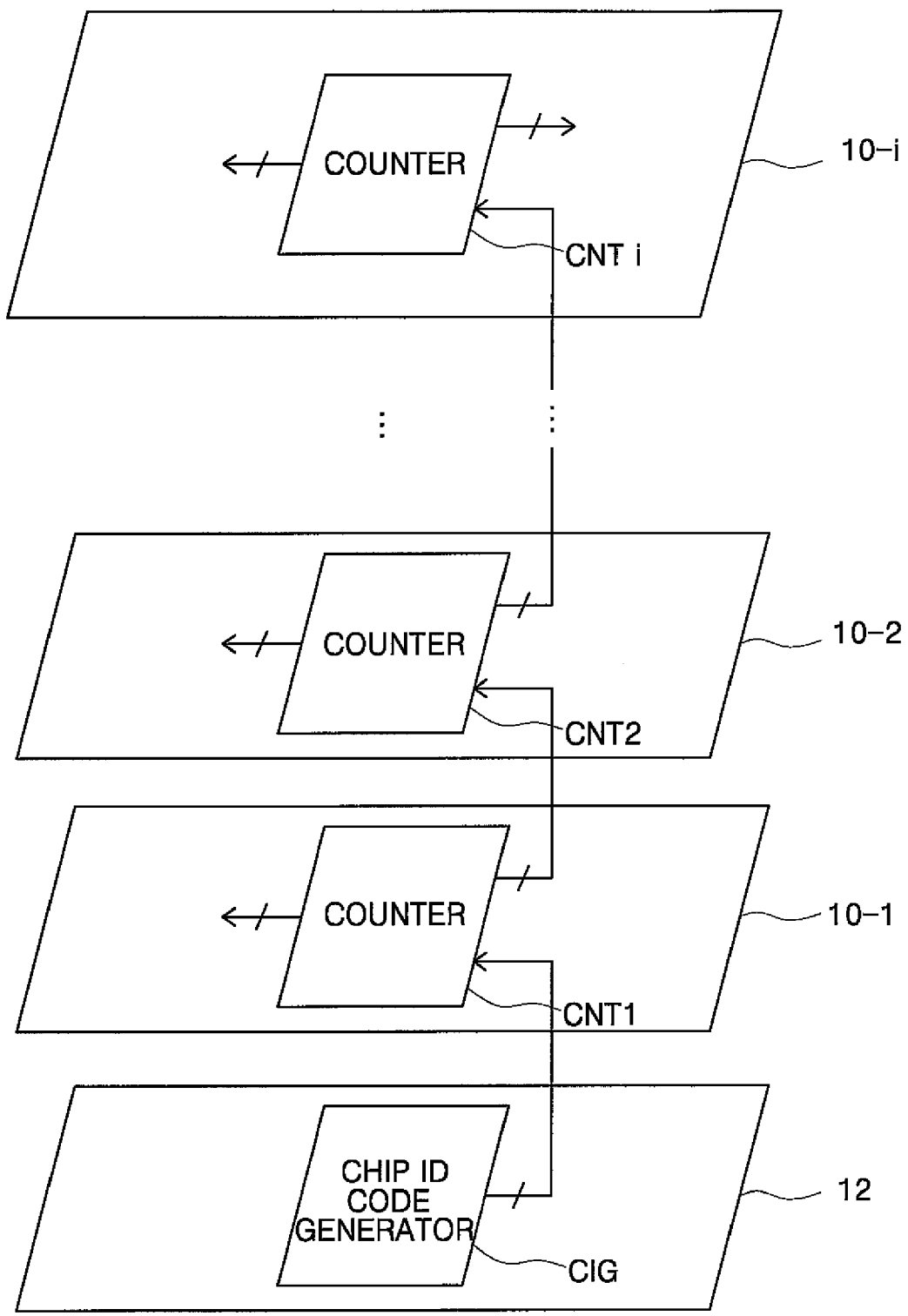
FIG. 1 is a diagram showing the configuration of a conventional semiconductor memory device in which a plurality of chips are stacked.
Figure 2:
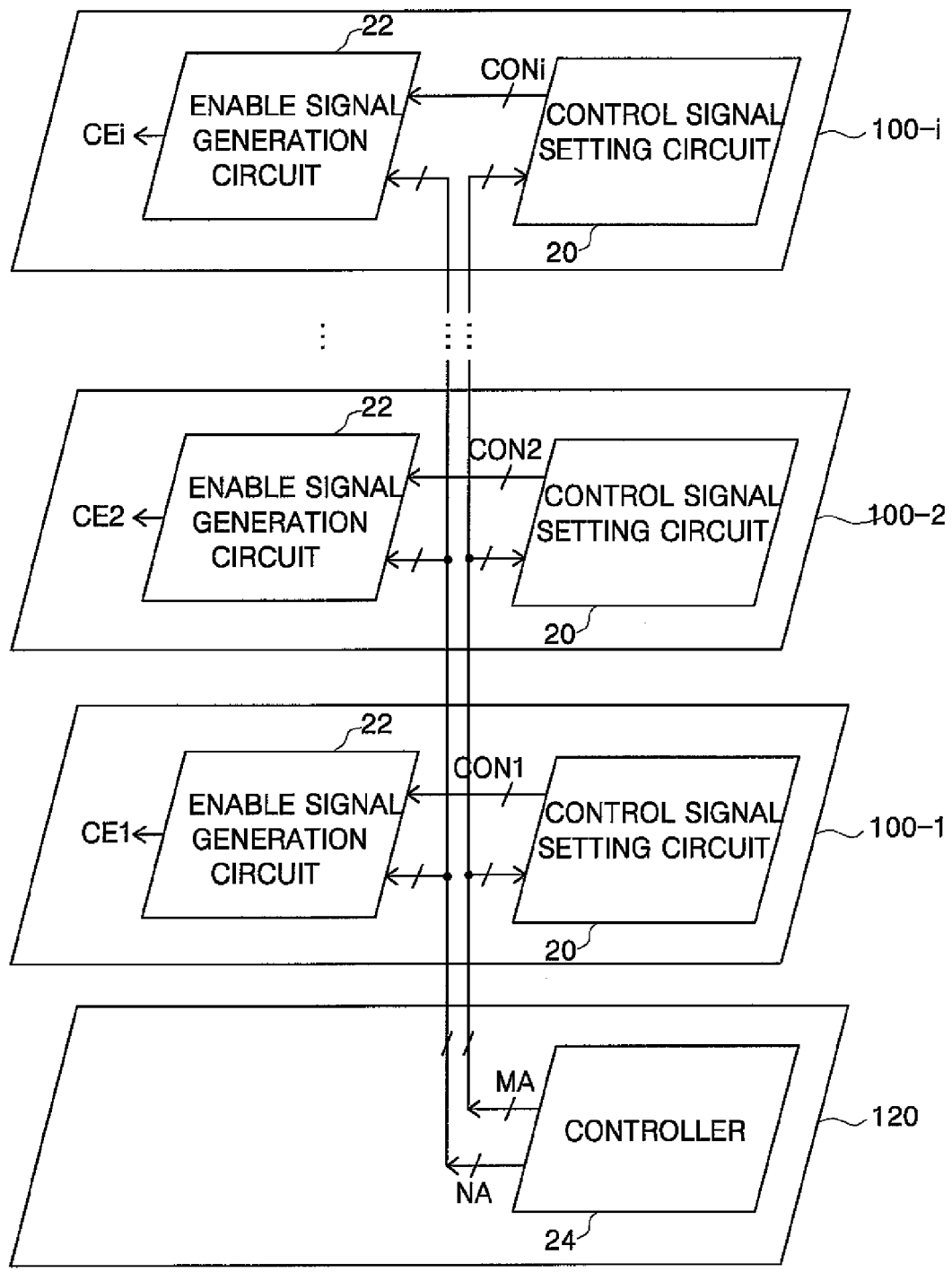
FIG. 2 is a diagram showing the configuration of a semiconductor memory device according to an exemplary embodiment of the present invention.

FIG. 2 is a diagram showing the configuration of a semiconductor memory device according to an exemplary embodiment of the present invention.

Referring to FIG. 2, the semiconductor memory device includes an i number of memory chips 100-1 to 100-i and an interface chip 120. Each of the memory chips 100-1 to 100-i includes a control signal setting circuit 20 and an enable signal generation circuit 22, and the interface chip 120 includes a controller 24.

Functions of the blocks shown in FIG. 2 will now be described.

The controller 24 generates a signal MA in response to an externally applied code signal, for example, an address signal applied through an address input terminal, during a mode register set (MRS) operation and generates as a chip identification (ID) signal NA a partial-bit signal of the address signal applied through the address input terminal during a normal operation. The signal MA may be the address signal applied through the address input terminal during the MRS operation or a combination of address signals applied through the address input terminal. The control signal setting circuits 20 of the memory chips 10-1 to 10-i receive the signal MA during the MRS operation and set different control signals CON1 to CONi, respectively. The enable signal generation circuits 200 of the memory chips 10-1 to 10-i receive row/column address signals RA/CA, compare the control signals CON1 to CONi with the chip ID signal NA of the row/column address signals RA/CA, and generate chip enable signals CE1 to CEi, respectively. When each of the control signals CON1 to CONi is equal to the chip ID signal NA, the corresponding chip enable signal CE1 to CEi is enabled. When each of the control signals CON1 to CONi is not equal to the chip ID signal NA, the corresponding chip enable signals CE1 to CEi is disabled.

Figure 3:
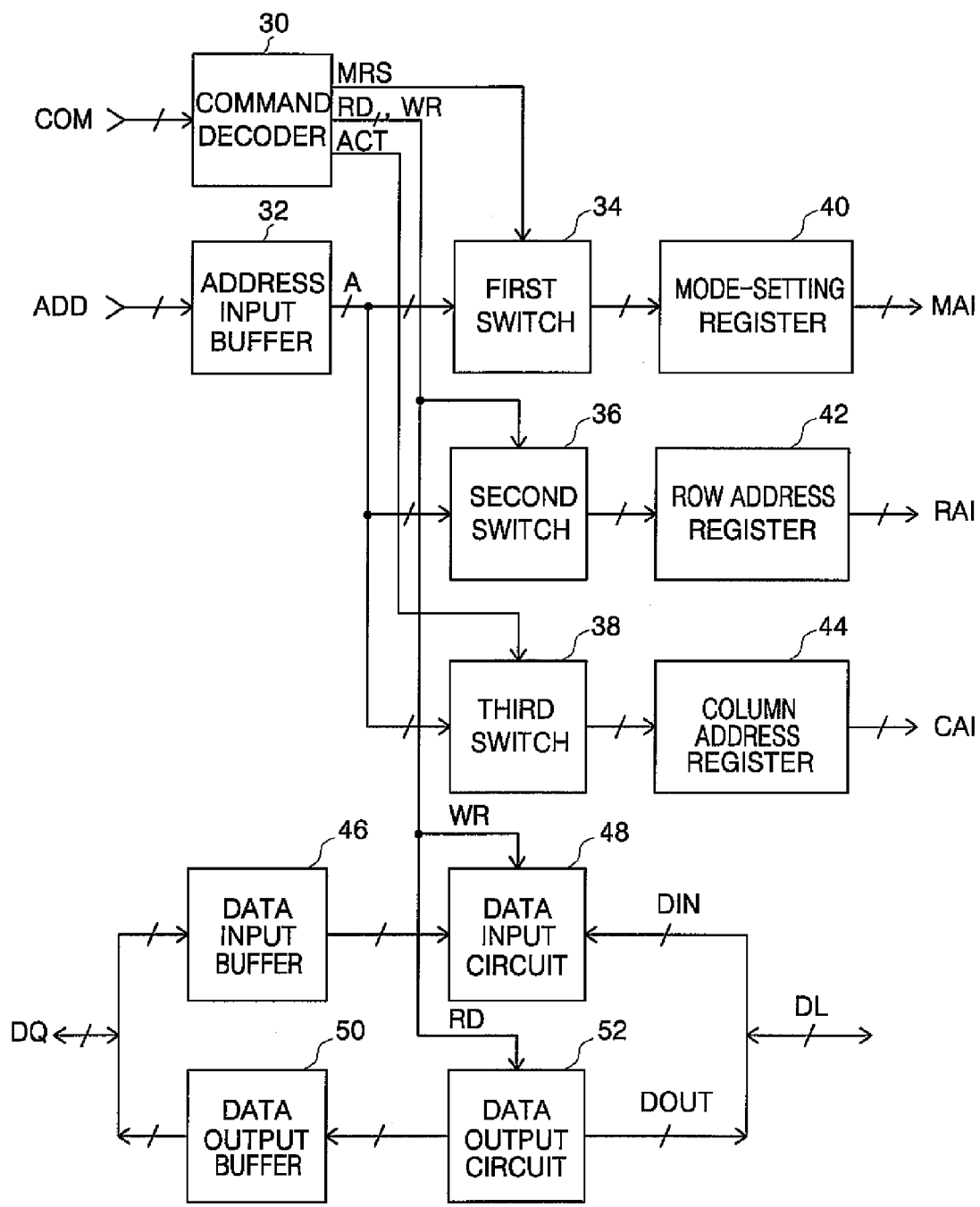
FIG. 3 is a block diagram of an interface chip shown in FIG. 2.

FIG. 3 is a block diagram of the interface chip shown in FIG. 2.

Referring to FIG. 3, the interface chip includes a command decoder 30, an address input buffer 32, first through third switches 34, 36, and 38, a mode-setting register 40, a row address register 42, a column address register 44, a data input buffer 46, a data input circuit 48, a data output buffer 50, and a data output circuit 52.

In FIG. 3, the command decoder 30, the address buffer 32, the first through third switches 34, 36, and 38, the mode-setting register 40, the row address register 42, and the column address register 44 constitute the controller 24 of FIG. 2.

Functions of the respective blocks shown in FIG. 3 will now be described.

The command decoder 30 decodes an externally applied command signal COM and generates an MRS command MRS, an active command ACT, a read command RD, and a write command WR. The address input buffer 32 buffers an externally applied address ADD and generates a buffered address A. The first switch 34 transmits the buffered address A in response to the MRS command MRS. The second switch 36 transmits the buffered address A in response to the read command RD or the write command WR. The third switch 38 transmits the buffered address A in response to the active command ACT. The mode-setting register 40 stores the buffered address A transmitted from the first switch 34 and outputs the signal MA. The row address register 42 stores the buffered address A transmitted from the second switch 36 and outputs a row address RA. The column address register 44 stores the buffered address A transmitted from the third switch 38 and outputs a column address CA. The data input buffer 46 buffers externally input data and generates buffered input data. The data input circuit 48 receives the buffered input data in response to the write command WR and outputs input data DIN to a data line DL. For example, the data input circuit 48 may convert the buffered input data into parallel data. The data output circuit 52 receives output data DOUT transmitted to the data line DL and generates data. The data output buffer 50 buffers the data generated by the data output circuit 52 and generates buffered output data. For example, the data output circuit 52 may convert the output data DOUT transmitted to the data line DL into serial data.

Figure 4:
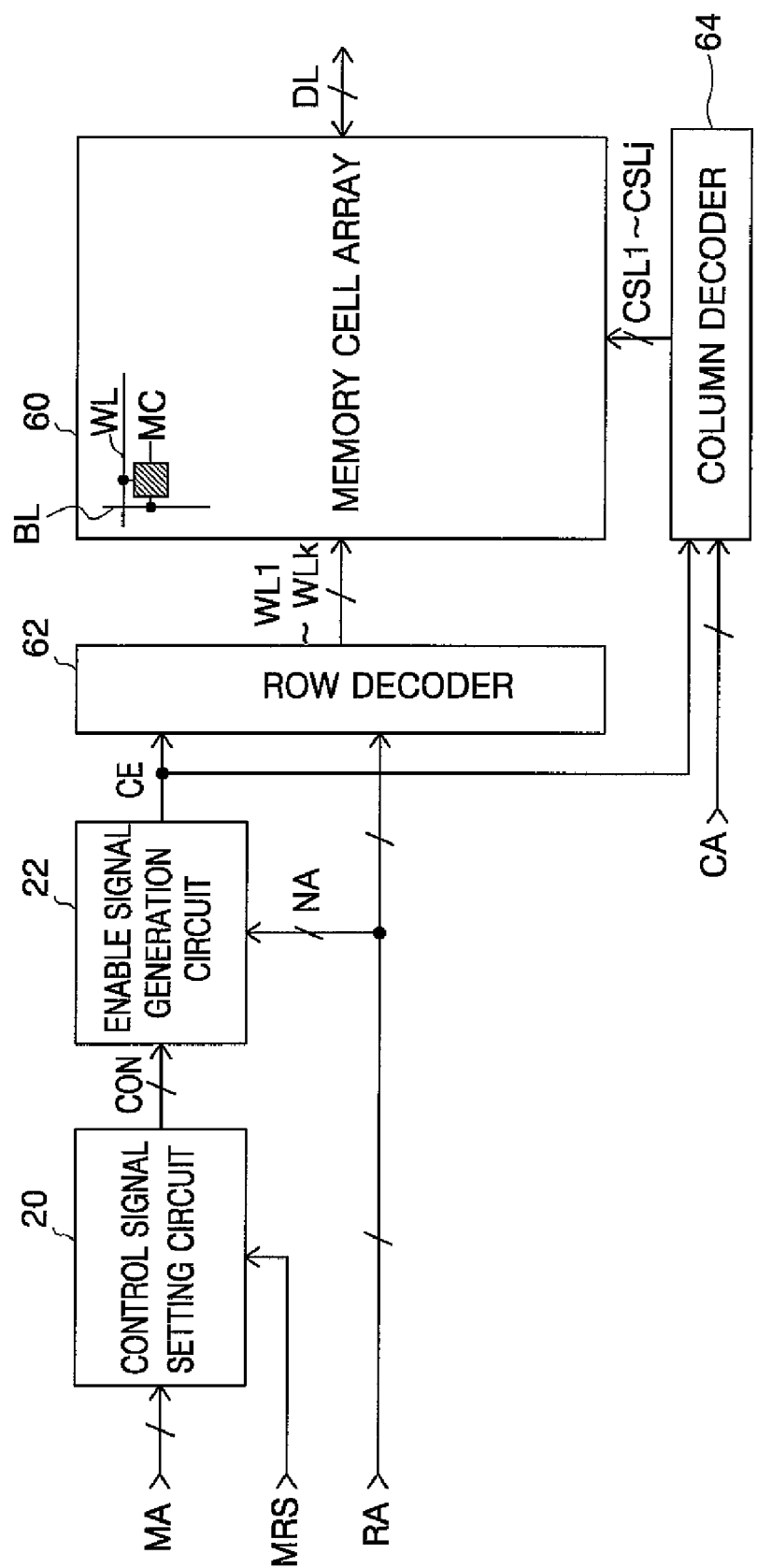
FIG. 4 is a block diagram of a memory chip shown in FIG. 2 according to an exemplary embodiment of the present invention.

FIG. 4 is a block diagram of the memory chip shown in FIG. 2 according to an exemplary embodiment of the present invention.

Referring to FIG. 2, the memory chip includes the control signal setting circuit 20, the enable signal generation circuit 22, a memory cell array 60, a row decoder 62, and a column decoder 64. The memory cell array 60 includes a memory cell MC connected between a word line WL and a bit line BL. A data line DL shown in FIG. 4 is connected to the data line DL shown in FIG. 3.

Functions of the respective blocks shown in FIG. 4 will now be described.

The control signal setting circuit 20 is enabled in response to the MRS command and sets a control signal CON in response to the signal MA. The enable signal generation circuit 22 receives the chip ID signal NA included in the row address RA in response to the control signal CON, makes a combination of chip ID signals, and generates a chip enable signal CE. The row decoder 62 is enabled in response to the chip enable signal CE, receives and decodes the remaining bits of the row address RA, and generates word line selection signals WL1 to WLk. The column decoder 64 is enabled in response to the chip enable signal CE, receives and decodes the column address CA, and generates column selection signals CSL1 to CSLj. In the memory cell array 60, a word line WL is selected in response to the word line selection signals WL1 to WLk and a bit line BL is selected in response to the column selection signals CSL1 to CSLj, so that data is input in or output from memory cells connected between the selected word line and the selected bit line. The data is input or output through the data line DL.

Figure 5:
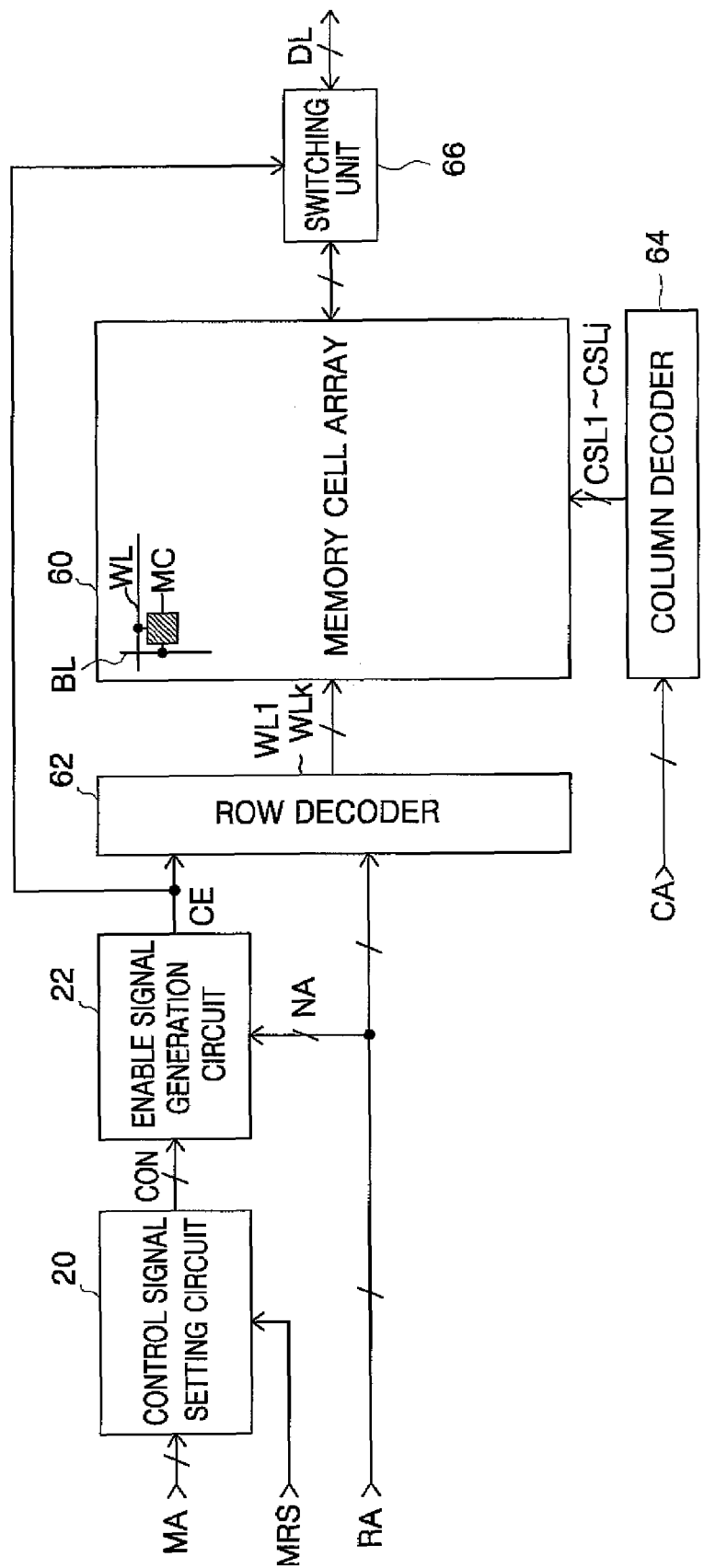
FIG. 5 is a block diagram of a memory chip shown in FIG. 2 according to another exemplary embodiment of the present invention.

FIG. 5 is a block diagram of the memory chip shown in FIG. 2 according to another exemplary embodiment of the present invention. The memory chip shown in FIG. 5 further includes a switching unit 66 when compared with the memory chip shown in FIG. 4.

Functions of the respective blocks shown in FIG. 5 will now be described.

The blocks having the same reference numerals perform the same functions as the blocks of FIG. 4, except that the row decoder 62 and the column decoder 64 of the memory chip shown in FIG. 5 do not operate in response to a chip enable signal CE. The switching unit 66 inputs or outputs data between the memory cell array 60 and the data line DL in response to the chip enable signal CE.

As compared with the memory chip shown in FIG. 4, that prevents the memory cell array 60 from performing a memory cell access operation in response to the chip enable signal CE, the memory chip shown in FIG. 5 prevents the input or output of data between the memory cell array 60 and the data line DL in response to the chip enable signal CE.

Figure 6:
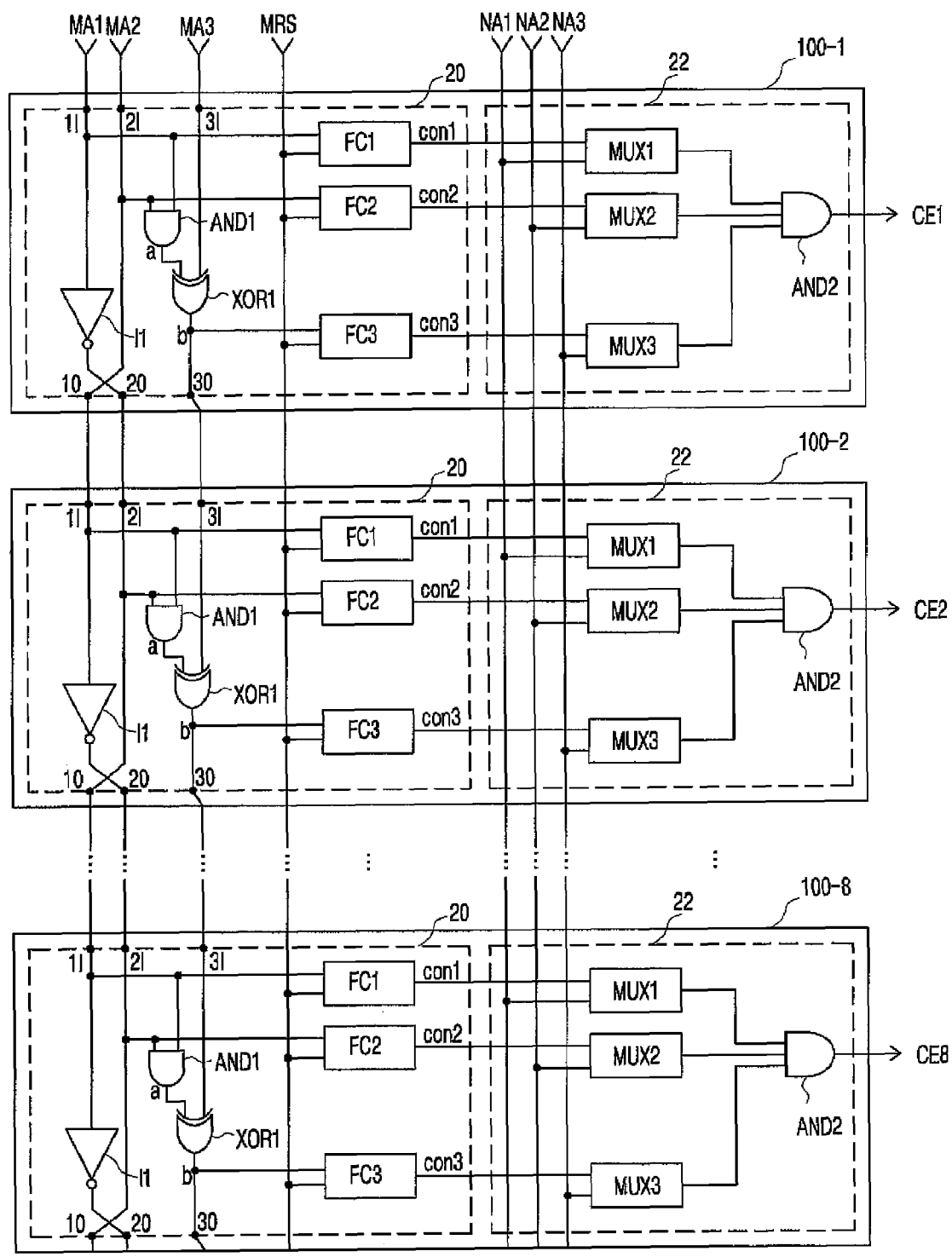
FIG. 6 is a diagram showing the configuration of a control signal setting circuit and an enable signal generation circuit shown in FIG. 2 according to an exemplary embodiment of the present invention.

FIG. 6 is a diagram showing the configuration of the control signal setting circuit and the enable signal generation circuit shown in FIG. 2 according to an exemplary embodiment of the present invention.

Referring to FIG. 6, the control signal setting circuit 20 of each of 8 memory chips 100-1 to 100-8 includes an inverter I1, an AND gate AND1, an XOR gate XOR1, and electrical fuse program circuits FC1 to FC3, and the enable signal generation circuit 22 includes multiplexers MUX1 to MUX3 and an AND gate AND2.

The configuration of the control signal setting circuit and the enable signal generation circuit as shown in FIG. 6 may be applied to a semiconductor memory device in which 8 memory chips are stacked.

Operation of the control signal setting circuit 20 shown in FIG. 6 will now be described.

The control signal setting circuit 20 of each of the memory chips 100-1 to 100-8 performs a logic AND operation on signals applied to a first input node 1I and a second input node 2I to generate a signal "a", performs a logic exclusive OR (XOR) operation on the signal "a" and a signal applied to a third input node 3I to generate a signal "b", inverts the signal applied to the first input node 1I to output the inverted signal through a second output node 2O, outputs the signal applied to the second input node 2I through a first output node 1O, and outputs the signal "b" through a third output node 3O. The AND gate AND1 performs a logic AND operation on signals MA1 and MA2 to generate the signal "a", and performs a logic XOR operation on the signal "a" and a signal MA3 to generate the signal "b". The inverter I1 inverts the signal MA1. The electrical fuse program circuits FC1 to FC3 are enabled in response to the MRS command and set (or program) control signals con1 to con3 in response to the signals MA1, MA2, and "b". The respective control signal setting circuits 20 of the memory chips 100-1 to 100-8 generate the control signals con1 to con3 having different values.

The following Table 1 shows the control signals con1 to con3 set by the respective control signal setting circuits 20 of the memory chips 100-1 to 100-8 when 3-bit signals MA1 to MA3 applied to the first through third input nodes 1I, 2I, and 3I are "000".

TABLE 1

|       | 1I | 2I | 3I | a | b | con1 | con2 | con3 |
|-------|----|----|----|---|---|------|------|------|
| 100-1 | 0  | 0  | 0  | 0 | 0 | 0    | 0    | 0    |
| 100-2 | 0  | 1  | 0  | 0 | 0 | 0    | 1    | 0    |
| 100-3 | 1  | 1  | 0  | 1 | 1 | 1    | 1    | 1    |
| 100-4 | 1  | 0  | 0  | 0 | 1 | 1    | 0    | 1    |
| 100-5 | 0  | 0  | 0  | 0 | 1 | 0    | 0    | 1    |
| 100-6 | 0  | 1  | 0  | 0 | 1 | 0    | 1    | 1    |
| 100-7 | 1  | 1  | 0  | 1 | 0 | 1    | 1    | 0    |
| 100-8 | 1  | 0  | 0  | 0 | 0 | 1    | 0    | 0    |

As can be seen from Table 1, the respective control signal setting circuits 20 of the memory chops 100-1 to 100-8 generate 3-bit control signals con1 to con3 having different values.

The memory chip 100-1 can be configured such that an output signal of the interface chip 120 is applied to the first through third input nodes 1I to 3I of the memory chip 100-1 during an MRS operation. Alternatively, the memory chip 100-1 can be configured such that the first through third input nodes 1I to 3I are connected to a power supply voltage application pad/line (not shown) or a ground voltage application pad/line (not shown) of the interface chip 120 during the MRS operation. In another case, the memory chip 100-1 can be configured such that the first through third input nodes 1I to 3I are connected to a power supply voltage application line (not shown) or a ground voltage application line (not shown) of the memory chip 100-1 during the MRS operation. In these configurations, a code signal for the signals MA1 to MA3 may not be externally applied during the MRS operation.

Operation of the enable signal generation circuit 22 shown in FIG. 6 will now be described.

The multiplexer MUX1 generates a comparison signal based on the result of a comparison of a chip ID signal NA1 and the signal applied through the first input node 1I. The multiplexer MUX2 generates a comparison result based on the result of a comparison of a chip ID signal NA2 and the signal applied through the second input node 2I. The multiplexer MUX3 generates a comparison result based on the result of a comparison of a chip ID signal NA3 and the signal applied through the third input node 3I. All the multiplexers MUX1 to MUX3 generate a comparison signal corresponding to a logic "1" or a logic "0" when 3-bit control signals con1 to con3 are equal to 3-bit chip ID signals NA1 to NA3. The AND gate AND2 performs a logic AND operation on signals output from the multiplexers MUX1 to MUX3 and generates chip enable signals CE1 to CE8. That is, the enable signal generation circuit 22 of each of the memory chips 100-1 to 100-8 enables the corresponding one of the chip enable signals CE1 to CE8 when each bit signal of the control signals con1 to con3 is equal to each bit signal of the chip ID signals NA1 to NA3.

Figure 7:
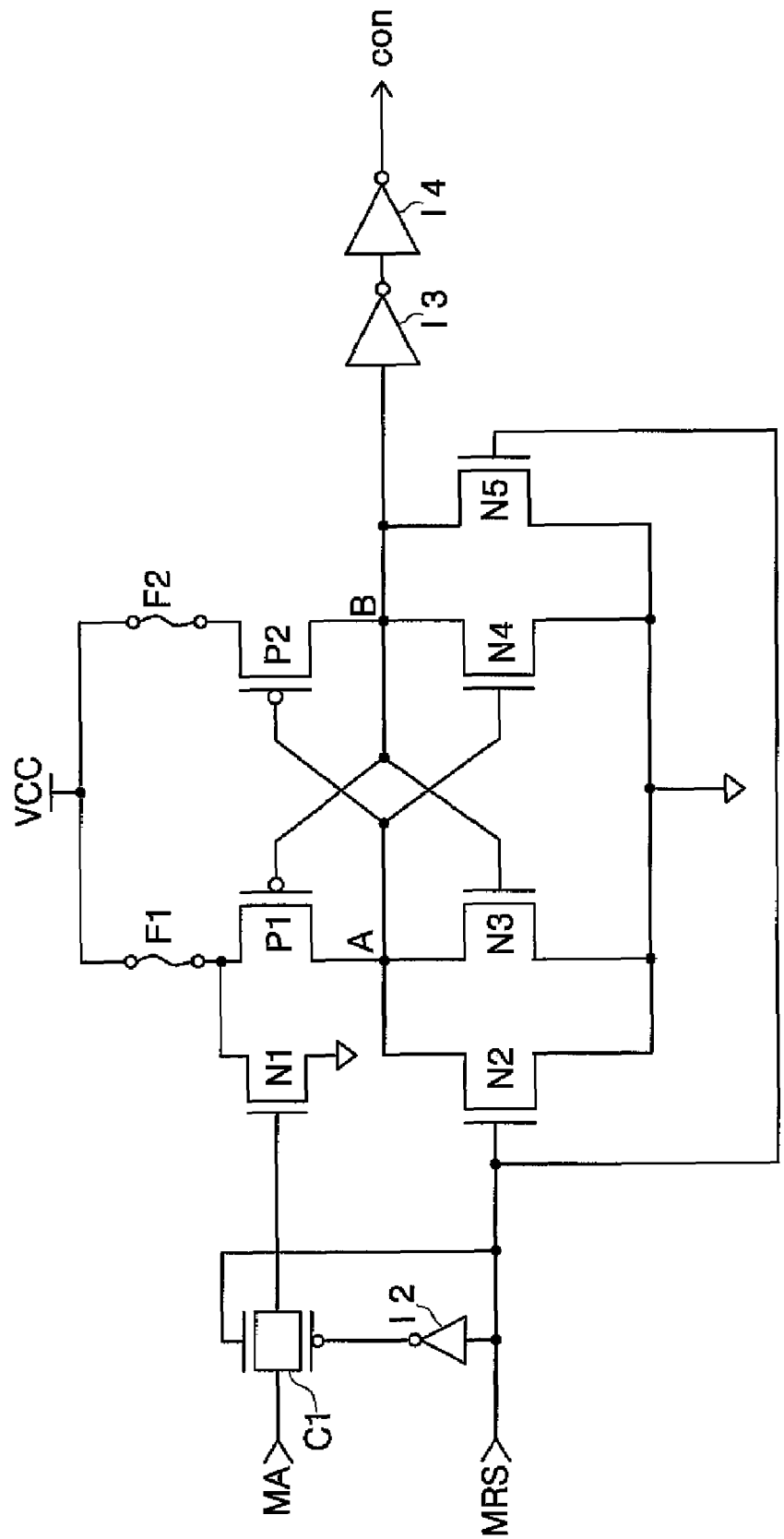
FIG. 7 is a circuit diagram of an electrical fuse program circuit shown in FIG. 6.

FIG. 7 is a circuit diagram of the electrical fuse program circuit shown in FIG. 6.

Referring to FIG. 7, the electrical fuse program circuit includes a CMOS transmission gate C1, inverters I2 to I4, NMOS transistors N1 to N5, PMOS transistors P1 and P2, and fuses F1 and F2.

In FIG. 7, the electrical fuse program circuit is designed such that the fuse F1 has a lower resistance than the fuse F2.

Operation of the electrical fuse program circuit shown in FIG. 7 will now be described.

When a high-level MRS command is applied, the CMOS transmission gate C1 is turned on. In this state, when a low-level signal MA is transmitted, the NMOS transistor N1 is turned off so that the fuse F1 is not cut. Also, the NMOS transistors N2 and N5 are turned on in response to the high-level MRS command. Then, a voltage of a node A becomes slightly higher than a voltage of a node B. As a result, a low-level control signal "con" is output through the inverters I3 and I4.

When the high-level MRS command is applied, the CMOS transmission gate C2 is turned on. In this state, when a high-level signal MA is transmitted, the NMOS transistor N1 is turned on so that the fuse F1 is cut. Also, the NMOS transistors N2 and N5 are turned on in response to the high-level MRS command. Then, a voltage of the node A becomes slightly lower than a voltage of the node B. As a result, a high-level control signal "con" is output through the inverters I3 and I4.

In other words, the electrical fuse program circuit shown in FIG. 7 generates the low-level control signal "con" when the high-level signal MA is transmitted in response to the high-level MRS command, and generates the high-level control signal "con" when the low-level signal MA is transmitted in response to the high-level MRS command. In the above-described manner, 3-bit control signals con1 to con3 of each of the memory chips 100-1 to 100-8 can be programmed to have different values.

Figure 8:
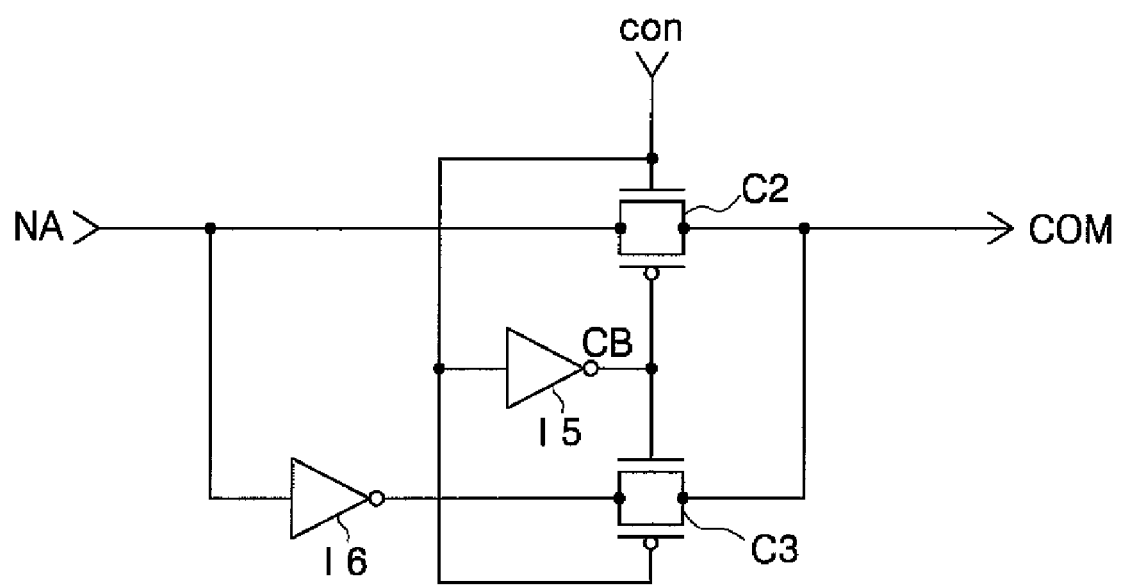
FIG. 8 is a circuit diagram of a multiplexer shown in FIG. 6.

FIG. 8 is a circuit diagram of each of the multiplexers shown in FIG. 6.

Referring to FIG. 8, the multiplexer includes CMOS transmission gates C2 and C3 and inverters I5 and I6.

Operation of the multiplexer shown in FIG. 8 will now be described.

The inverter I5 inverts the control signal "con" and generates an inverted control signal. The inverter I6 inverts the chip ID signal NA and generates an inverted address. The CMOS transmission gate C2 is turned on in response to a first-state control signal (i.e., a high-level control signal "con") and transmits the chip ID signal NA as a comparison signal COM. The CMOS transmission gate C3 is turned on in response to a second-state control signal (i.e., a low-level control signal "con") and transmits the inverted chip ID signal NA as the comparison signal COM.

The multiplexer shown in FIG. 8 generates a high-level comparison signal COM when both the control signal "con" and the chip ID signal NA are at a high level or a low level. Also, the multiplexer shown in FIG. 8 generates a low-level comparison signal COM when the control signal "con" is at a high level and the chip ID signal NA is at a low level, or when the control signal "con" is at a low level and the chip ID signal NA is at a high level. In other words, the multiplexer shown in FIG. 8 generates the first-state comparison signal (i.e., the high-level comparison signal) when the control signal "con" is equal to the chip ID signal NA, and generates the second-state comparison signal (i.e., the low-level comparison signal) when the control signal "con" differs from the chip ID signal NA.

Figure 9:
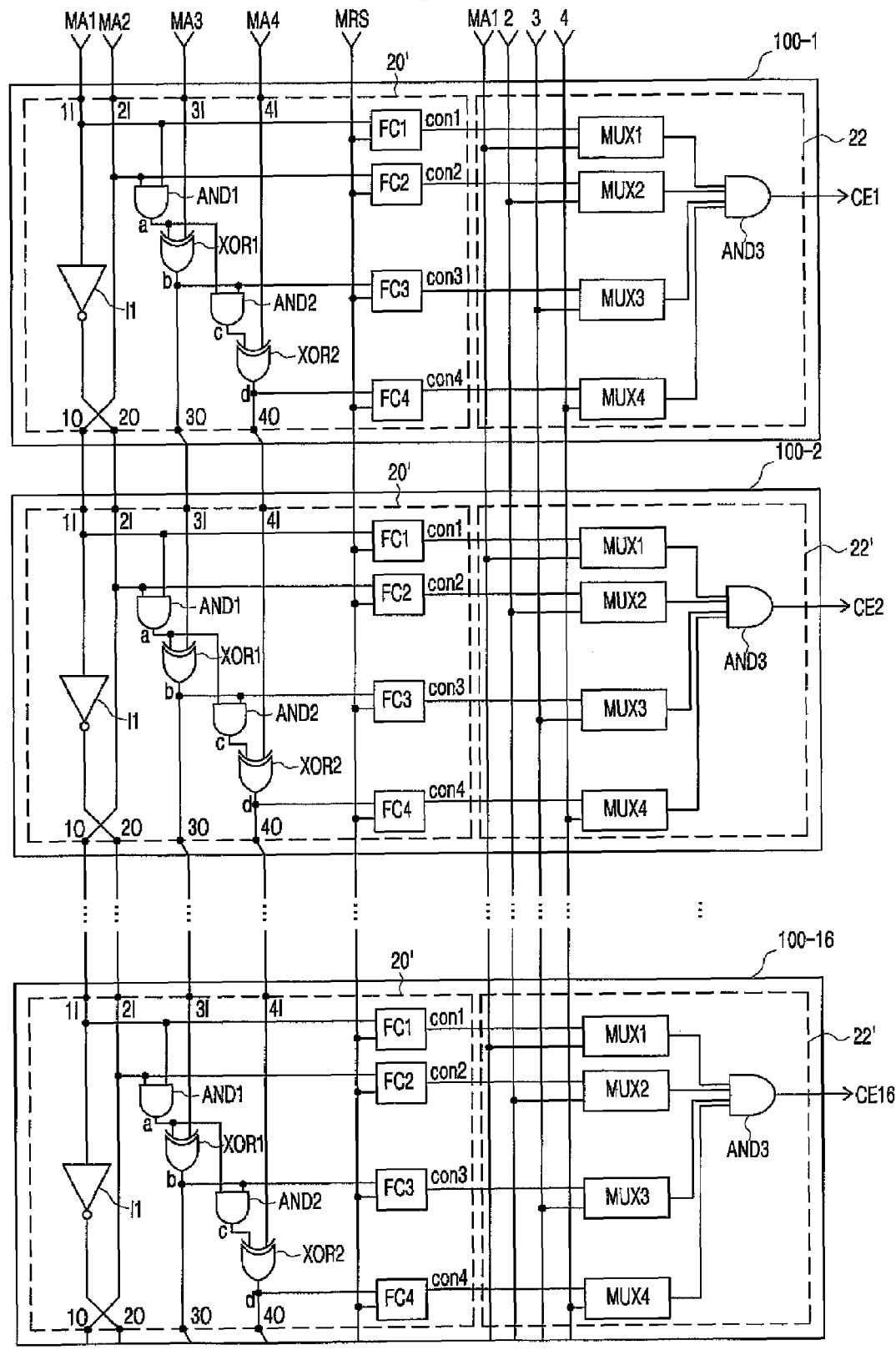
FIG. 9 is a diagram showing the configuration of the control signal setting circuit and the enable signal generation circuit shown in FIG. 2 according to another exemplary embodiment of the present invention.

FIG. 9 is a diagram showing the configuration of the control signal setting circuit and the enable signal generation circuit shown in FIG. 2 according to another exemplary embodiment of the present invention.

Referring to FIG. 9, a control signal setting circuit 20' of each of 16 memory chips 100-1 to 100-8 includes an inverter I1, AND gates AND1 and AND2, XOR gates XOR1 and XOR2, and electrical fuse program circuits FC1 to FC4, and an enable signal generation circuit 22' includes multiplexers MUX1 to MUX4 and an AND gate AND3.

The control signal setting circuit 20' and the enable signal generation circuit 22' shown in FIG. 9 may be applied to a semiconductor memory device in which 16 memory chips are stacked.

Operation of the control signal setting circuit shown in FIG. 9 will now be described.

The inverter I1, the AND gate AND1, and the XOR gate XOR1 perform the same functions as the inverter I1, the AND gate AND1, and the XOR gate XOR1 of FIG. 5. The AND gate AND2 performs a logic AND operation on signals "a" and "b" and generates a signal "c". The XOR gate XOR2 performs a logic XOR operation on the signal "c" and a signal "d" applied through a fourth input node 4I and generates a signal "d". The electrical fuse program circuits FC1 to FC4 are enabled in response to an MRS command and set (or program) control signals con1 to con4 in response to the signals MA1, MA2, "b", and "d". The respective control signal setting circuits 20' of the memory chips 100-1 to 100-16 generate the control signals con1 to con4 having different values.

That is, the control signal setting circuit 20' of each of the memory chips 100-1 to 100-8 as shown in FIG. 9 performs a logic AND operation on the signals applied to the first and second input nodes 1I and 2I to generate the signal "a", performs a logic XOR operation on the signal "a" and the signal applied to the third input node 3I to generate the signal "b", performs a logic AND operation on the signals "a" and "b" to generate the signal "c", performs a logic XOR operation on the signal "c" and the signal applied to the fourth input node 4I to generate the signal "d", inverts the signal applied to the first input node 1I to output the inverted signal through a second output node 2O, outputs the signal applied to the second input node 2I through a first output node 1O, outputs the signal "b" through a third output node 3O, and outputs the signal "d" through the fourth output node 4O.

The following Table 2 show the control signals con1 to con4 set by the respective control signal setting circuits 20' of the memory chips 100-1 to 100-8 when 4-bit control signals MA1 to MA4 applied to the first through fourth input nodes 1I, 2I, 3I, and 4I are "0000".

TABLE 2

| | 1I | 2I | 3I | 4I | a | b | c | d | con1 | con2 | con3 | con4 |
|---|---|---|---|---|---|---|---|---|---|---|---|---|
| 100-1 | 0 | 0 | 0 | 0 | 0 | 0 | 0 | 0 | 0 | 0 | 0 | 0 |
| 100-2 | 0 | 1 | 0 | 0 | 0 | 0 | 0 | 0 | 0 | 1 | 0 | 0 |
| 100-3 | 1 | 1 | 0 | 0 | 1 | 1 | 1 | 1 | 1 | 1 | 1 | 1 |
| 100-4 | 1 | 0 | 1 | 1 | 0 | 1 | 0 | 1 | 1 | 0 | 1 | 1 |
| 100-5 | 0 | 0 | 1 | 1 | 0 | 1 | 0 | 1 | 0 | 0 | 1 | 1 |
| 100-6 | 0 | 1 | 1 | 1 | 0 | 1 | 0 | 1 | 0 | 1 | 1 | 1 |
| 100-7 | 1 | 1 | 1 | 1 | 1 | 0 | 0 | 1 | 1 | 1 | 0 | 1 |
| 100-8 | 1 | 0 | 0 | 1 | 0 | 0 | 0 | 1 | 1 | 0 | 0 | 1 |
| 100-9 | 0 | 0 | 0 | 1 | 0 | 0 | 0 | 1 | 0 | 0 | 0 | 1 |
| 100-10 | 0 | 1 | 0 | 1 | 0 | 0 | 0 | 1 | 0 | 1 | 0 | 1 |
| 100-11 | 1 | 1 | 0 | 1 | 1 | 1 | 1 | 0 | 1 | 1 | 1 | 0 |
| 100-12 | 1 | 0 | 1 | 0 | 0 | 1 | 0 | 0 | 1 | 0 | 1 | 0 |
| 100-13 | 0 | 0 | 1 | 0 | 0 | 1 | 0 | 0 | 0 | 0 | 1 | 0 |
| 100-14 | 0 | 1 | 1 | 0 | 0 | 1 | 0 | 0 | 0 | 1 | 1 | 0 |
| 100-15 | 1 | 1 | 1 | 0 | 1 | 0 | 0 | 0 | 1 | 1 | 0 | 0 |
| 100-16 | 1 | 0 | 0 | 0 | 0 | 0 | 0 | 0 | 1 | 0 | 0 | 0 |

As can be seen from Table 2, the respective control signal setting circuits 20' of the memory chops 100-1 to 100-16 generate 4-bit control signals con1 to con4 having different values.

The respective control signal setting circuits 20' of the memory chips 100-1 to 100-16 according to the present invention may have the same configuration and set the 4-bit control signals con1 to con4 having different values.

Operation of the enable signal generation circuit 22' shown in FIG. 9 will now be described.

The multiplexers MUX1 to MUX3 perform the same functions as the multiplexers MUX1 to MUX3 shown in FIG. 5. The multiplexer MUX4 generates a comparison signal based on the result of a comparison of a chip ID signal NA4 and a signal applied through the fourth input node 4I. All the multiplexers MUX1 to MUX4 generate a comparison signal corresponding to a logic "1" or a logic "0" when 4-bit control signals con1 to con4 are equal to 4-bit chip ID signals NA1 to NA4. The AND gate AND3 performs a logic AND operation on signals output from the multiplexers MUX1 to MUX4 and generates chip enable signals CE1 to CE16. In other words, the enable signal generation circuit 22' of each of the memory chips 100-1 to 100-16 enables the corresponding one of the chip enable signals CE1 to CE16 when each bit signal of the control signals con1 to con4 is equal to each bit signal of the chip ID signals NA1 to NA4.

The electrical fuse program circuit shown in FIG. 9 may have the same configuration as that shown in FIG. 7, and the multiplexer shown in FIG. 9 may have the same configuration as that shown in FIG. 8.

When a semiconductor memory device according to the present invention is fabricated by stacking 32 memory chips, control signal setting circuits of the 32 memory chips may be programmed to generate 5-bit control signals having different values. Therefore, each of the 32 memory chips may be configured such that 5-bit input signals MA1 to MA5 are applied to first through fifth input nodes, respectively. Also, the control signal setting circuit shown in FIG. 8 may further include an AND gate for performing a logic AND operation on signals "c" and "d" and an XOR gate for performing a logic XOR operation on an output signal of the added AND gate and a signal MA5. Furthermore, each of the 32 memory chips may be configured such that a signal MA2, an inverted signal of a signal MA1, signals "b" and "d", and an output signal of the added XOR gate are output through first through fifth output nodes, respectively.

The control signal setting circuit of the memory chip as shown in FIG. 6 and FIG. 9 may further include a single AND gate and a single XOR gate every time the number of bits of a control signal to be generated is increased by as much as 1.

When n-bit input signals are applied to first through n-th input nodes, the foregoing control signal setting circuit of the memory chip according to the present invention generates data applied to the first and second input nodes as less significant 2-bit control signals of n-bit control signals. Each bit signal of more significant n−2-bit control signals is obtained by performing a logic XOR operation on a signal obtained by performing a logic AND operation on the less significant 2-bit control signals and each bit signal of more significant n−2-bit input signals. For example, a third less significant bit control signal con3 is obtained by performing a logic XOR operation on a signal obtained by performing a logic AND operation on control signals con1 and con2 and a signal applied to the third input node. Also, a fourth less significant bit control signal con4 is obtained by performing a logic XOR operation on a signal obtained by performing a logic AND operation on control signals con2 and con3 and a signal applied to the fourth input node. Furthermore, the control signal setting circuit inverts the data applied to the first input node to output the inverted data through the second output node, outputs the data applied to the second input node to the first output node, and outputs the respective bit signals of the more significant n−2-bit control signals through the third through n-th output nodes.

Figure 10:
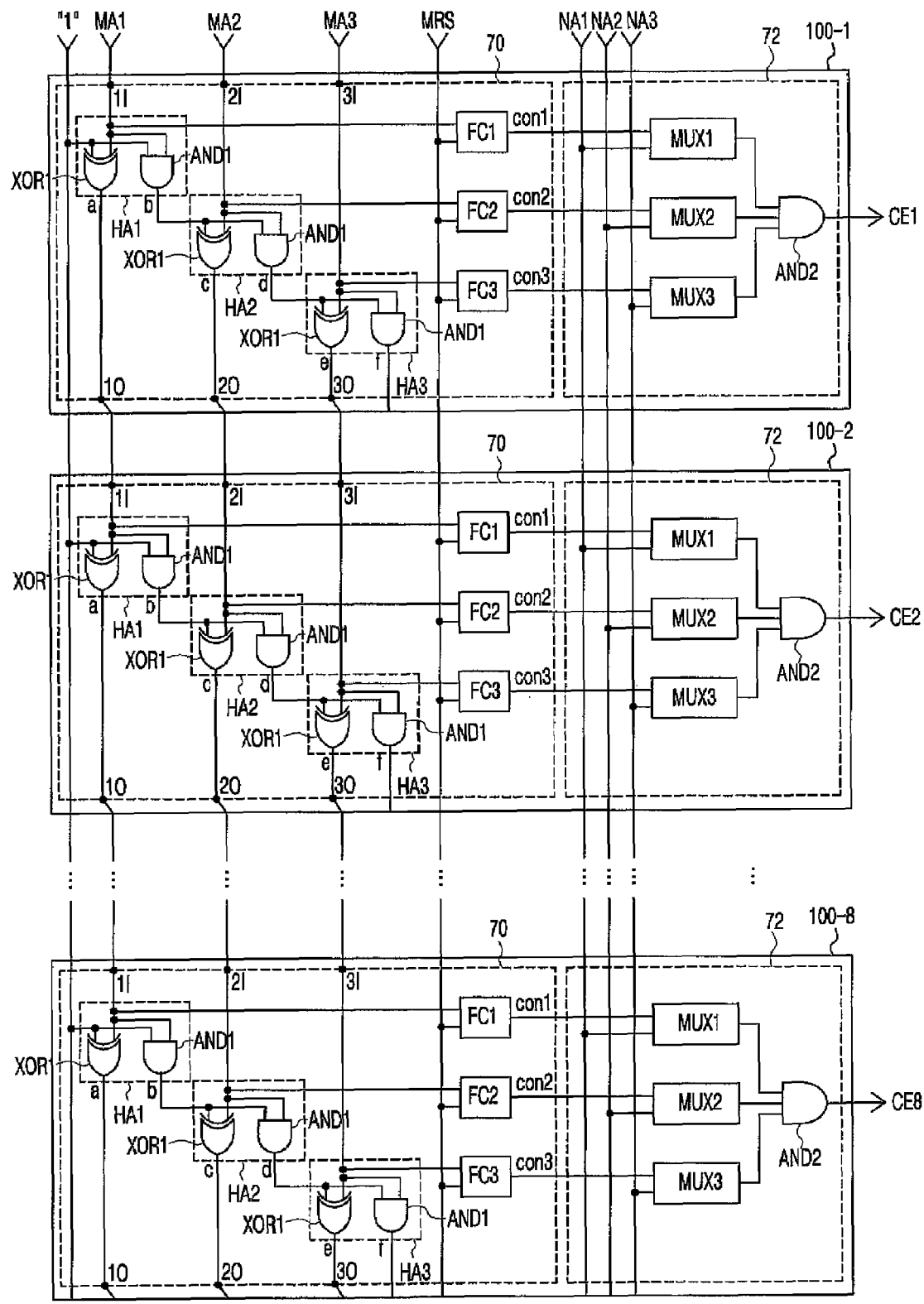
FIG. 10 is a diagram showing the configuration of the control signal setting circuit and the enable signal generation circuit shown in FIG. 2 according to yet another exemplary embodiment of the present invention.

FIG. 10 is a diagram showing the configuration of the control signal setting circuit and the enable signal generation circuit shown in FIG. 2 according to yet another exemplary embodiment of the present invention.

Referring to FIG. 10, a control signal setting circuit 70 of each of 8 memory chips includes three half adders HA1 to HA3 and electrical fuse program circuits FC1 to FC3, and an enable signal generation circuit 72 of each of the 8 memory chips includes multiplexers MUX1 to MUX3 and an AND gate AND4. Also, each of the half adders HA1 to HA3 includes an AND gate AND1 and an XOR gate XOR1.

The control signal setting circuit 70 and the enable signal generation circuit 72 shown in FIG. 10 may be applied to a semiconductor memory device in which 8 memory chips are stacked, in the same way as the control signal setting circuit 20 and the enable signal generation circuit 22 shown in FIG. 6.

Operation of the control signal setting circuit 70 shown in FIG. 10 will now be described.

The XOR gate XOR1 of the half adder HA1 performs a logic XOR operation on high-level data and a signal MA1 to generate a sum signal "a", and the AND gate AND1 of the half adder HA1 performs a logic AND operation on the high-level data and the signal MA1 to generate a carry signal "b". The XOR gate XOR1 of the half adder HA2 performs a logic XOR operation on the carry signal "b" and a signal MA2 to generate a sum signal "c", and the AND gate AND1 of the second half adder HA2 performs a logic AND operation on the carry signal "b" and the signal MA2 to generate a carry signal "d". The XOR gate XOR1 of the half adder HA3 performs a logic XOR operation on the carry signal "d" and a signal MA3 to generate a sum signal "e", and the AND gate AND1 of the half adder HA3 performs a logic AND operation on the carry signal "d" and the signal MA3 to generate a carry signal "f". The AND gate AND1 of the half adder HA3 may be omitted or remain as a dummy gate.

The control signal setting circuit 70 shown in FIG. 10 performs a logic XOR operation on high-level data and a first bit signal of n-bit input signals applied through first through third input nodes 1I to 3I to generate the sum signal "a", performs a logic AND operation on the high-level data and the first bit signal of the n-bit input signals to generate the carry signal "b", performs a logic XOR operation on the carry signal "b" and a second bit signal of the n-bit input signals to generate a sum signal "c", performs a logic AND operation on the carry signal "b" and the second bit signal of the n-bit input signals to generate a carry signal "d", and performs a logic XOR operation on the carry signal "d" and a third bit signal of the n-bit input signals to generate a sum signal "e". Also, the control signal setting circuit 70 receives the signals applied through the first through third input nodes 1I to 3I as 3-bit control signals con1 to con3.

The following Table 3 show the control signals con1 to con4 set by the respective control signal setting circuits 70 of the memory chips 100-1 to 100-8 when 3-bit control signals MA1 to MA3 applied to the first through third input nodes 1I, 2I, and 3I are "000".

TABLE 3

| | 1I | 2I | 3I | a | b | c | d | e | c1 | c2 | c3 |
|---|---|---|---|---|---|---|---|---|---|---|---|
| 100-1 | 0 | 0 | 0 | 1 | 0 | 0 | 0 | 0 | 1 | 0 | 0 |
| 100-2 | 1 | 0 | 0 | 0 | 1 | 1 | 0 | 0 | 0 | 1 | 0 |
| 100-3 | 0 | 1 | 0 | 1 | 0 | 1 | 0 | 0 | 1 | 1 | 0 |
| 100-4 | 1 | 1 | 0 | 0 | 1 | 0 | 1 | 1 | 0 | 0 | 1 |
| 100-5 | 0 | 0 | 1 | 1 | 0 | 0 | 0 | 1 | 1 | 0 | 1 |
| 100-6 | 1 | 0 | 1 | 0 | 1 | 1 | 0 | 1 | 0 | 1 | 1 |
| 100-7 | 0 | 1 | 1 | 1 | 0 | 1 | 0 | 1 | 1 | 1 | 1 |
| 100-8 | 1 | 1 | 1 | 0 | 1 | 0 | 1 | 0 | 0 | 0 | 0 |

As can be seen from Table 3, the respective control signal setting circuits 70 of the memory chops 100-1 to 100-8 generate 3-bit control signals con1 to con3 having different values.

The enable signal generation circuit 72 shown in FIG. 10 performs the same operation as the enable signal generation circuit 22 shown in FIG. 5.

By removing the half adder HA3 or the AND gate AND1 of each of the half adders HA3 and HA2 from the control signal setting circuit shown in FIG. 10, each of the memory chips may generate 2-bit control signals con1 and con2 having different values. Also, by adding a single half adder or a single XOR gate to the control signal setting circuit 70 shown in FIG. 10, each of the memory chips may generate 4-bit control signals con1 to con4 having different values. That is, the control signal setting circuit 70 shown in FIG. 10 may further include an XOR gate, which performs a logic XOR operation on the signal "f" and data applied through a fourth input node (not shown) to generate an XOR operated signal, and an AND to gate, which performs a logic AND operation on the signal "f" and the data applied through the fourth input node to generate an AND operated signal. Alternatively, the control signal setting circuit 70 shown in FIG. 10 may further include only an XOR gate, which performs a logic XOR operation on the signal "f" and the data applied through the fourth input node to generate an XOR operated signal.

Therefore, when n-bit input data is applied through first through n-th input nodes, the control signal setting circuit of the memory chips according to the present invention generates the n-bit input data as n-bit control signals, performs a logic XOR operation on each of signals obtained by performing a logic AND operation on each of first through n-th bit input data and less significant bit data of each of the first through n-th bit input data and each of first through n-th bit data, and outputs the XOR n-bit data through first through n-th output nodes. Also, a first bit control signal is obtained by performing a logic XOR operation on data "1" and first-bit data.

Figure 11:
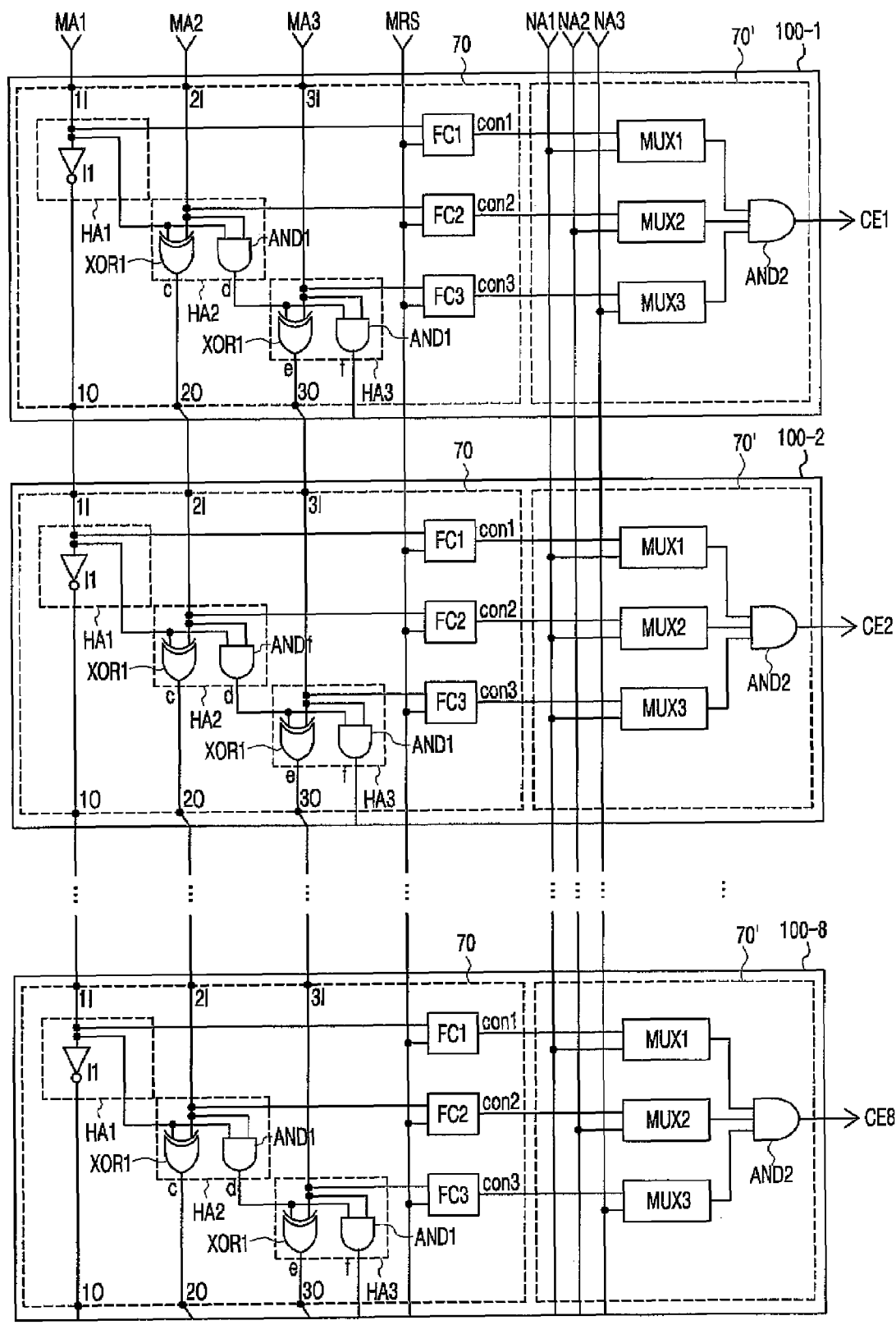
FIG. 11 is a diagram showing the configuration of the control signal setting circuit and the enable signal generation circuit shown in FIG. 2 according to further another exemplary embodiment of the present invention.

FIG. 11 is a diagram showing the configuration of the control signal setting circuit and the enable signal generation circuit shown in FIG. 2 according to further another exemplary embodiment of the present invention.

Referring to FIG. 11, a control signal setting circuit 70' includes an inverter I1 instead of the half adder HA1 and the XOR gate XOR1 of FIG. 10 and excludes the AND gate AND1 of FIG. 10. In FIG. 11, the AND gate AND1 of the half adder HA3 may be omitted.

The control signal setting circuit 70' of each memory chip shown in FIG. 11 may have a simpler configuration than that of FIG. 10 and can generate 3-bit control signals having different values as shown in Table 3.

The enable signal generation circuit 72' shown in FIG. 11 performs the same operation as the enable signal generation circuit 22 shown in FIG. 6.

In the above-described embodiments of the present invention, the control signal setting circuit sets each bit signal of control signals using the electrical fuse program circuits.

However, although not shown in the drawings, the control signal setting circuit may use registers or latches instead of the electrical fuse program circuits so that the control signal setting circuit may set each bit signal of control signals in response to an MRS command during an MRS operation, and output data stored in the registers or latches during a normal operation. That is, in the above-described embodiments, the electrical fuse program circuits may be replaced by the registers or the latches.

Also, the configurations of the control signal setting circuit and the enable signal generation circuit according to the above-described embodiments of the present invention may be applied to semiconductor memory devices in which at least five memory chips are stacked.

In the above-described embodiments of the present invention, a power supply voltage or a ground voltage may be applied to the memory chip 100-1 disposed adjacent to the interface chip 120 during the MRS operation instead of applying an output signal of the mode-setting register 40 to the memory chips 100-1 to 100-i of the semiconductor memory device. In this configuration, the code signal for the signals MA1 to MA3 may not be externally applied during the MRS operation.

However, it is not absolutely necessary to apply the above-described method of generating a chip enable signal to semiconductor memory devices in which four or fewer memory chips are stacked.

Figure 12:
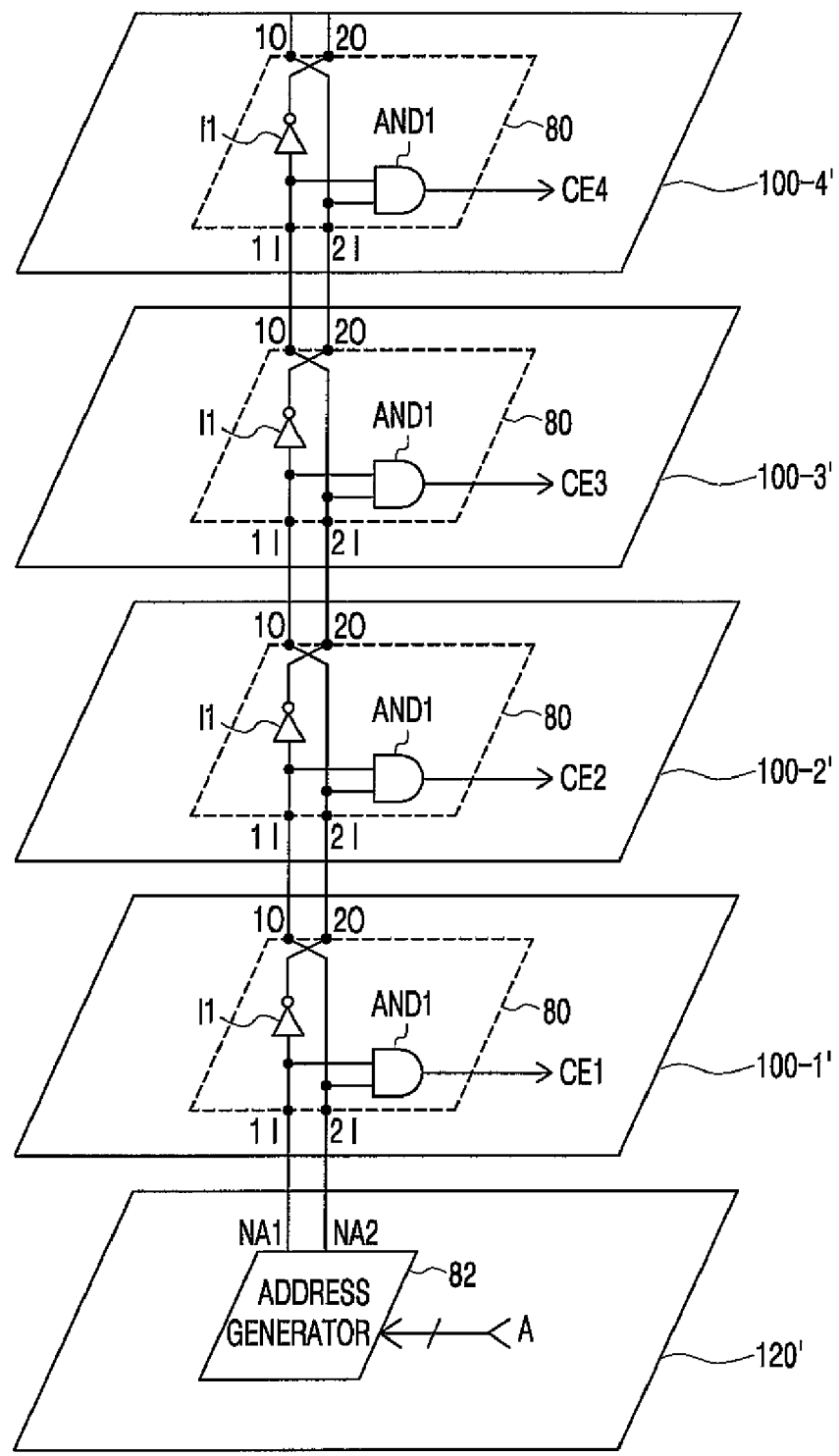
FIG. 12 is a diagram showing the configuration of a semiconductor memory device according to another exemplary embodiment of the present invention.

FIG. 12 is a diagram showing the configuration of a semiconductor memory device according to another exemplary embodiment of the present invention.

Referring to FIG. 12, the semiconductor memory device includes four memory chips 100-1' to 100-4' and an interface chip 120'. Each of the four memory chips 100-1' to 100-4' includes an enable signal generation circuit 80, which includes an inverter I1 and an AND gate AND1, and the interface chip 120' includes an address generator 82.

Functions of the respective blocks shown in FIG. 12 will now be described.

The address generator 82 of the interface chip 120' receives an externally applied address A during a normal operation and generates 2-bit chip ID signals NA1 and NA2 included in the address A. The chip ID signals NA1 and NA2 are used to select one of the four memory chips 100-1' to 100-4'. The enable signal generation circuit 80 of each of the memory chips 100-1' to 100-4' performs a logic AND operation on signals applied to first and second input nodes 1I and 2I to generate chip enable signals CE1 to CE4, inverts the signal applied to the first input node 1I to output the inverted signal through a second output node 2O, and outputs the signal applied to the second input node 2I through a first output node 1O. The AND gate AND1 performs a logic AND operation on the signals applied to the first and second input nodes 1I and 2I to generate the chip enable signals CE1 to CE4, and the inverter I1 inverts the signal applied to the first input node 1I to output the inverted signal to the second output node 2O.

The interface chip 120' shown in FIG. 12 generates 2-bit addresses of row addresses RA output from the row address register 42 shown in FIG. 3 as the chip ID signals NA1 and NA2. Also, each of the memory chips 100-1' to 100-4' shown in FIG. 12 includes the enable signal generation circuit 80 instead of the control signal setting circuit 20 and the enable signal generation circuit 22 shown in FIG. 4.

The semiconductor memory device shown in FIG. 12 can generate the chip enable signals CE1 to CE4 using the chip ID signals NA1 and NA2 included in a row address (or a column address) that is externally applied during a normal operation, unlike the semiconductor memory devices according to the previous embodiments of the present invention, which set a control signal during an MRS operation and generate a chip enable signal when a chip ID signal applied during a normal operation is equal to the set control signal.

In the above-described embodiments of the present invention, when a memory cell array of each memory chip includes a plurality of memory cell array banks, not only a row address but also a bank address are externally applied during a normal operation. In this case, a chip ID signal may be included in the bank address so that each of the memory chips can generate a chip enable signal using the chip ID signal included in the bank address.

According to the present invention as described above, a semiconductor memory device includes a plurality of memory chips having the same configuration so that the memory chips can be fabricated using the same fabrication process. Furthermore, the semiconductor memory device has a simple circuit configuration and can generate chip ID signals at the same time without delay.

Exemplary embodiments of the present invention have been disclosed herein and, although specific terms are employed, they are used and are to be interpreted in a generic and descriptive sense only and not for purposes of limitation. Accordingly, it will be understood by those of ordinary skill in the art that various changes in form and details may be made without departing from the spirit and scope of the present invention as set forth in the following claims.

What is claimed is:

1. A semiconductor memory device comprising a plurality of memory chips and an interface chip that are stacked, each memory chip comprising a control signal setting unit, which sets input signals applied to first and second input nodes as less significant 2-bit control signals of n-bit control signals, performs a logic AND operation on the less significant 2-bit control signals to generate AND operated signals, performs a logic XOR operation on each of the AND operated signals and each bit signal of more significant n-2-bit input signals applied to third to n-th input nodes to set the n-2-bit control signals, outputs the signal applied to the second input node through a first output node, inverts the signal applied to the first input node to output the inverted signal through a second output node, and outputs the more significant n-2-bit input signals through third through n-th output nodes, respectively, wherein first through n-th output nodes of one of two adjacent memory chips are respectively connected to first through n-th input nodes of the other of the two adjacent memory chips.

2. The device according to claim 1, wherein the input signals are applied to the first through n-th input nodes of one memory chip disposed adjacent to the interface chip during a mode register set (MRS) operation.

3. The device according to claim 1, wherein a power supply voltage is applied to the first through n-th input nodes of one memory chip disposed adjacent to the interface chip during the MRS operation.

4. The device according to claim 1, wherein a ground voltage is applied to the first through n-th input nodes of one memory chip disposed adjacent to the interface chip during the MRS operation.

5. The device according to claim 1, wherein the control signal setting unit comprises:

an inverter for inverting the input signal applied to the first input node to generate a first signal;

AND gates for performing a logic AND operation on by the less significant 2-bit input signals of the n-bit input signals applied to the first through n-th input nodes to generate second signals; and XOR gates for performing a logic XOR operation on each of the second signals and each of the input signals applied to the third to n-th input nodes to generate the more significant n-2-bit control signals.

6. The device according to claim 5, wherein the control signal setting unit further comprises an electrical fuse program circuit, which is enabled during the MRS operation and programs the control signals depending on whether a fuse is cut or not in response to the input signals applied to the first and second input nodes and each bit signal of the more significant n–2-bit control signals.

7. The device according to claim 5, wherein the control signal setting unit further comprises a storage portion, which stores and outputs the input signals applied to the first and second input nodes and each bit signal of the more significant n-2-bit control signals.

8. The device according to claim 1, wherein each of the memory chips further comprises an enable signal generation unit, which generates a chip enable signal when the n-bit control signal is equal to an n-bit chip identification (ID) signal.

9. The device according to claim 8, wherein the chip ID signal is used to select one of the memory chips and applied along with a row address during a normal operation.

10. The device according to claim 8, wherein the chip ID signal is used to select one of the memory chips and applied along with a bank address during a normal operation.

11. The device according to claim 8, wherein the chip ID signal is used to select one of the memory chips and applied along with a column address during a normal operation.

12. The device according to claim 8, wherein the enable signal generation unit comprises:
multiplexers for generating a first-state comparison signal when each of the n-bit control signals is equal to each of the n-bit chip ID signals and generating a second-state comparison signal when each of the n-bit control signals is not equal to each of the n-bit chip ID signals; and
an AND gate for generating the chip enable signal when the multiplexers generate the first-state comparison signals.

13. The device according to claim 12, wherein each of the multiplexers comprises:
an inverter for inverting the corresponding bit of the chip ID signal to generate an inverted chip ID signal;
a first transmission gate being turned on in response to the corresponding bit of the control signal to transmit the corresponding bit of the chip ID signal as the comparison signal; and
a second transmission gate being turned on in response to a phase-inverted signal of the corresponding bit of the control signal to transmit the inverted chip ID signal as the comparison signal.

14. A semiconductor memory device comprising a plurality of memory chips and an interface chip that are stacked, each memory chip comprising a control signal setting unit, which generates input signals applied to first through n-th input nodes as n-bit control signals and performs a logic AND operation on the input signals applied to the first through n-th input nodes and less significant bit signals of the respective input signals applied to the first through n-th input nodes and outputs respective sum signals on each of the input signals through second through n-th input nodes and respective bit signals excluding n-th bit signal of respective AND operated signals obtained by performing the logic AND operation to second through n-th output nodes, respectively,
wherein first through n-th output nodes of one of two adjacent memory chips are respectively connected to first through n-th input nodes of the other of the two adjacent memory chips.

15. The device according to claim 14, wherein the input signals are applied to the first through n-th input nodes of one memory chip disposed adjacent to the interface chip during an MRS operation.

16. The device according to claim 14, wherein a power supply voltage is applied to the first through n-th input nodes of one memory chip disposed adjacent to the interface chip during the MRS operation.

17. The device according to claim 14, wherein a ground voltage is applied to the first through n-th input nodes of one memory chip disposed adjacent to the interface chip during the MRS operation.

18. The device according to claim 14, wherein the control signal setting unit further comprises an electrical fuse program circuit, which is enabled during the MRS operation and programs the control signals depending on whether a fuse is cut or not in response to the input signals applied to the first through n-th input nodes.

19. The device according to claim 14, wherein the control signal setting unit further comprises a storage portion, which stores and outputs the input signals applied to the first through n-th input nodes.

20. The device according to claim 14, wherein the control signal setting unit comprises:
XOR gates for performing a logic XOR operation on each bit signal of n-bit input signals applied through the first through n-th input nodes and each of carry signals of a previous stage to generate the sum signals; and
AND gates for performing a logic AND operation on each bit signal of the n-bit input signals applied through the first through n-th input nodes and the carry signals applied from the previous memory chip to generate carry signals.

21. The device according to claim 20, wherein a first stage XOR gate of the XOR gates performs a logic XOR operation on the input signal applied through the first input node and a high-level signal to generate the sum signal, and a first stage AND gate of the AND gates performs a logic AND operation on the input signal applied through the first input node and the high-level signal to generate the carry signal.

22. The device according to claim 14, wherein the control signal setting unit comprises:
an inverter for inverting a least significant bit input signal applied through the first input node to output the inverted signal through the first output node;
XOR gates for performing a logic XOR operation on each of n-1-bit input signals applied through the second to n-th input nodes and a carry signal of a previous stage to generate the sum signals; and
AND gates for performing a logic AND operation on each of the n-1-bit input signals applied through the second to n-th input nodes and the carry signal applied from the previous memory chip to generate carry signals.

23. The device according to claim 22, wherein a first stage XOR gate of the XOR gates performs a logic XOR operation on the input signal applied through the first input node and the input signal applied through the second input node to generate the sum signal, and a first stage AND gate of the AND gates performs a logic AND operation on the input signal applied through the first input node and the input signal applied through the second input node to generate the carry signal.

24. The device according to claim 14, wherein each of the memory chips further comprises an enable signal generation unit, which generates a chip enable signal when the n-bit control signal is equal to an n-bit chip ID signal.

25. The device according to claim 24, wherein the chip ID signal is used to select one of the memory chips and applied along with a row address during a normal operation.

26. The device according to claim 24, wherein the chip ID signal is used to select one of the memory chips and applied along with a bank address during a normal operation.

27. The device according to claim 24, wherein the chip ID signal is used to select one of the memory chips and applied along with a column address during a normal operation.

28. The device according to claim 24, wherein the enable signal generation unit comprises:
multiplexers for generating a first-state comparison signal when each of the n-bit control signals is equal to each of the n-bit chip ID signals and generating a second-state comparison signal when each of the n-bit control signals is not equal to each of the n-bit chip ID signals; and an AND gate for generating the chip enable signal when the multiplexers generate the first-state comparison signals.

29. The device according to claim 28, wherein each of the multiplexers comprises:
an inverter for inverting the corresponding bit of the chip ID signal to generate an inverted chip ID signal;
a first transmission gate being turned on in response to the corresponding bit of the control signal to transmit the corresponding bit of the chip ID signal as the comparison signal; and
a second transmission gate being turned on in response to a phase-inverted signal of the corresponding bit of the control signal to transmit the inverted chip ID signal as the comparison signal.

30. A semiconductor memory device comprising four or fewer memory chips and an interface chip that are stacked, each memory chip comprising an enable signal generation unit, which performs a logic AND operation on input signals applied to first and second input nodes to generate a chip enable signal, outputs the input signal applied to the second input signal through a first output node, and inverts the input signal applied to the first input node to output the inverted signal through a second output node,
wherein first and second output nodes of one of two adjacent memory chips are respectively connected to first and second input nodes of the other of the two adjacent memory chips.

31. The device according to claim 30, wherein the input signals applied to the first and second input nodes of a memory chip disposed adjacent to the interface chip are applied along with a row address during a normal operation.

32. The device according to claim 30, wherein the input signals applied to the first and second input nodes of a memory chip disposed adjacent to the interface chip are applied along with a bank address during a normal operation.

33. The device according to claim 30, wherein the input signals applied to the first and second input nodes of a memory chip disposed adjacent to the interface chip are applied along with a column address during a normal operation.

34. The device according to claim 30, wherein the enable signal generation unit comprises:
an AND gate for performing a logic AND operation on the input signals applied to the first and second input nodes; and
an inverter for inverting the input signal applied to the first input node.

35. A method of generating a chip enable signal of a semiconductor memory device in which a plurality of memory chips and an interface chip are stacked, each memory chip comprising first through n-th input nodes and first through n-th output nodes, and the first through n-th input nodes of one of two adjacent memory chips are respectively connected to the first through n-th output nodes of the other of the two adjacent memory chips, the method comprising:
setting 2-bit input signals applied to the first and second input nodes as less significant 2-bit control signals of n-bit control signals and performing a logic AND operation on by the less significant 2-bit control signals to generate AND operated signals;
performing a logic XOR operation on each of the AND operated signals and each bit signal of more significant n−2-bit input signals applied to the third to n-th input nodes to generate n−2-bit control signals;
outputting the signal applied to the second input node through a first output node, outputting an inverted signal of the signal applied to the first input node through a second output node, and outputting the more significant n−2-bit input signals through third to n-th output nodes, respectively;
storing and outputting the control signal during an MRS operation; and
generating the chip enable signal during a normal operation when the control signal is equal to a chip ID signal output from the interface chip.

36. The method according to claim 35, wherein a power supply voltage or a ground voltage is applied to the first through n-th input nodes during the MRS operation.

37. A method of generating a chip enable signal of a semiconductor memory device in which a plurality of memory chips and an interface chip are stacked, each memory chip comprising first through n-th input nodes and first through n-th output nodes, and the first through n-th input nodes of one of two adjacent memory chips are respectively connected to the first through n-th output nodes of the other of the two adjacent memory chips, the method comprising:
generating input signals applied to the first through n-th input nodes as n-bit control signals;
performing a logic AND operation on the input signals applied to the first through n-th input nodes and less significant bit signals of the respective input signals applied to the first through n-th input nodes and outputting respective sum signals on each of the input signals through second through n-th input nodes and respective bit signals excluding n-th bit signal of respective AND operated signals obtained by performing the logic AND operation to second through n-th output nodes, respectively;
storing and outputting the control signal during an MRS operation; and
generating the chip enable signal during a normal operation when the control signal is equal to a chip ID signal output from the interface chip.

38. The method according to claim 37, wherein a power supply voltage or a ground voltage is applied to the first through n-th input nodes during the MRS operation.

* * * * *